(12) United States Patent
Berry et al.

(10) Patent No.: US 8,319,338 B1
(45) Date of Patent: Nov. 27, 2012

(54) THIN STACKED INTERPOSER PACKAGE

(75) Inventors: Christopher J. Berry, Chandler, CA (US); Christopher M. Scanlan, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 354 days.

(21) Appl. No.: 12/832,202

(22) Filed: Jul. 8, 2010

Related U.S. Application Data

(63) Continuation of application No. 11/865,617, filed on Oct. 1, 2007, now Pat. No. 7,777,351.

(51) Int. Cl.
*H01L 23/48* (2006.01)
(52) U.S. Cl. .......... 257/738; 257/E23.021; 257/E23.116
(58) Field of Classification Search ............. 257/778, 257/787, 734, 737, 738, E23.021, E23.116
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp et al. | |
| 4,812,896 A | 3/1989 | Rothgery et al. | |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Matthew Reames
*Assistant Examiner* — Nikolay Yushin
(74) *Attorney, Agent, or Firm* — Stetina Brunda Garred & Brucker

(57) ABSTRACT

The present invention comprises a semiconductor package comprising a bottom semiconductor package substrate which is populated with one or more electronic components. The electronic component(s) of the bottom substrate are covered or encapsulated with a suitable mold compound which hardens into a package body of the semiconductor package. The package body is provided with one or more vias through the completion of laser drilling process, such via(s) providing access to one or more corresponding conductive contacts of the bottom substrate. These vias are either lined or partially filled with a conductive metal material. Subsequently, a top semiconductor package substrate (which may optionally be populated with one or more electronic components) is mounted to the package body and electrically connected to the conductive metal within the via(s) of the package body.

20 Claims, 6 Drawing Sheets

U.S. PATENT DOCUMENTS

| | | |
|---|---|---|
| 4,862,245 A | 8/1989 | Pashby et al. |
| 4,862,246 A | 8/1989 | Masuda |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi |
| 5,134,773 A | 8/1992 | LeMaire |
| 5,151,039 A | 9/1992 | Murphy |
| 5,157,475 A | 10/1992 | Yamaguchi |
| 5,157,480 A | 10/1992 | McShane |
| 5,168,368 A | 12/1992 | Gow |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto |
| 5,278,446 A | 1/1994 | Nagaraj et al. |
| 5,279,029 A | 1/1994 | Burns |
| 5,281,849 A | 1/1994 | Singh Deo |
| 5,285,352 A | 2/1994 | Pastore et al. |
| 5,294,897 A | 3/1994 | Notani |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire |
| 5,424,576 A | 6/1995 | Djennas et al. |
| 5,428,248 A | 6/1995 | Cha |
| 5,434,057 A | 7/1995 | Dorian |
| 5,444,301 A | 8/1995 | Song |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono |
| 5,528,076 A | 6/1996 | Pavio |
| 5,534,467 A | 7/1996 | Rostoker |
| 5,539,251 A | 7/1996 | Iverson |
| 5,543,657 A | 8/1996 | Diffenderfer |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda |
| 5,633,528 A | 5/1997 | Abbott |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda |
| 5,726,493 A | 3/1998 | Yamashita et al. |
| 5,736,432 A | 4/1998 | Mackessy |
| 5,745,984 A | 5/1998 | Cole et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song |
| 5,776,798 A | 7/1998 | Quan et al. |
| 5,783,861 A | 7/1998 | Son |
| 5,801,440 A | 9/1998 | Chu |
| 5,814,877 A | 9/1998 | Diffenderfer |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| 6,143,981 A | 11/2000 | Glenn |
| 6,166,430 A | 12/2000 | Yamaguchi |
| 6,169,329 B1 | 1/2001 | Farnworth |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,250 B1 | 2/2001 | Melton et al. |
| 6,194,777 B1 | 2/2001 | Abbott |
| 6,197,615 B1 | 3/2001 | Song |
| 6,198,171 B1 | 3/2001 | Huang |
| 6,201,186 B1 | 3/2001 | Daniels et al. |
| 6,201,292 B1 | 3/2001 | Yagi et al. |
| 6,204,554 B1 | 3/2001 | Ewer |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. |
| 6,218,731 B1 | 4/2001 | Huang et al. |

| | | | | | | |
|---|---|---|---|---|---|---|
| 6,222,258 B1 | 4/2001 | Asano et al. | | 6,583,503 B2 | 6/2003 | Akram |
| 6,222,259 B1 | 4/2001 | Park | | 6,603,196 B2 | 8/2003 | Lee |
| 6,225,146 B1 | 5/2001 | Yamaguchi et al. | | 6,624,005 B1 | 9/2003 | DiCaprio |
| 6,229,200 B1 | 5/2001 | Mclellan et al. | | 6,646,339 B1 | 11/2003 | Ku |
| 6,229,205 B1 | 5/2001 | Jeong | | 6,667,546 B2 | 12/2003 | Huang et al. |
| 6,239,367 B1 | 5/2001 | Hsuan | | 6,677,663 B1 | 1/2004 | Ku |
| 6,239,384 B1 | 5/2001 | Smith | | 6,686,649 B1 | 2/2004 | Mathews et al. |
| 6,242,281 B1 | 6/2001 | Mclellan et al. | | 6,696,752 B2 | 2/2004 | Su |
| 6,256,200 B1 | 7/2001 | Lam et al. | | 6,700,189 B2 | 3/2004 | Shibata |
| 6,258,629 B1 | 7/2001 | Niones et al. | | 6,713,375 B2 | 3/2004 | Shenoy |
| 6,281,566 B1 | 8/2001 | Magni | | 6,740,964 B2 | 5/2004 | Sasaki |
| 6,281,568 B1 | 8/2001 | Glenn et al. | | 6,757,178 B2 | 6/2004 | Okabe |
| 6,282,095 B1 | 8/2001 | Houghton | | 6,800,936 B2 | 10/2004 | Kosemura et al. |
| 6,285,075 B1 | 9/2001 | Combs et al. | | 6,812,552 B2 | 11/2004 | Islam et al. |
| 6,291,271 B1 | 9/2001 | Lee | | 6,858,919 B2 | 2/2005 | Seo et al. |
| 6,291,273 B1 | 9/2001 | Miyaki et al. | | 6,867,492 B2 | 3/2005 | Auburger et al. |
| 6,294,100 B1 | 9/2001 | Fan et al. | | 6,878,571 B2 | 4/2005 | Isaak et al. |
| 6,294,830 B1 | 9/2001 | Fjelstad | | 6,897,552 B2 | 5/2005 | Nakao |
| 6,295,977 B1 | 10/2001 | Ripper et al. | | 6,927,478 B2 | 8/2005 | Paek |
| 6,297,548 B1 | 10/2001 | Moden et al. | | 7,002,805 B2 | 2/2006 | Lee et al. |
| 6,303,984 B1 | 10/2001 | Corisis | | 7,005,327 B2 | 2/2006 | Kung |
| 6,303,997 B1 | 10/2001 | Lee | | 7,015,571 B2 | 3/2006 | Chang |
| 6,307,272 B1 | 10/2001 | Takahashi et al. | | 7,053,469 B2 | 5/2006 | Koh et al. |
| 6,309,909 B1 | 10/2001 | Ohgiyama | | 7,102,209 B1 | 9/2006 | Bayan et al. |
| 6,316,822 B1 | 11/2001 | Venkateshwaran | | 7,185,426 B1 | 3/2007 | Hiner et al. |
| 6,316,838 B1 | 11/2001 | Ozawa et al. | | 7,242,081 B1 | 7/2007 | Lee |
| 6,323,550 B1 | 11/2001 | Martin | | 7,315,080 B1 | 1/2008 | Fan et al. |
| 6,326,243 B1 | 12/2001 | Suzuya et al. | | 7,345,361 B2 | 3/2008 | Mallik et al. |
| 6,326,244 B1 | 12/2001 | Brooks | | 7,372,151 B1 | 5/2008 | Fan et al. |
| 6,326,678 B1 | 12/2001 | Karnezos et al. | | 7,777,351 B1 | 8/2010 | Berry et al. |
| 6,335,564 B1 | 1/2002 | Pour | | 2001/0008305 A1 | 7/2001 | McLellan et al. |
| 6,337,510 B1 | 1/2002 | Chun-Jen et al. | | 2001/0014538 A1 | 8/2001 | Kwan et al. |
| 6,339,255 B1 | 1/2002 | Shin | | 2002/0011654 A1 | 1/2002 | Kimura |
| 6,348,726 B1 | 2/2002 | Bayan | | 2002/0024122 A1 | 2/2002 | Jung |
| 6,355,502 B1 | 3/2002 | Kang et al. | | 2002/0027297 A1 | 3/2002 | Ikenaga et al. |
| 6,359,221 B1 | 3/2002 | Yamada et al. | | 2002/0038873 A1 | 4/2002 | Hiyoshi |
| 6,362,525 B1 | 3/2002 | Rahim | | 2002/0111009 A1 | 8/2002 | Huang et al. |
| 6,369,447 B2 | 4/2002 | Mori | | 2002/0140061 A1 | 10/2002 | Lee |
| 6,369,454 B1 | 4/2002 | Chung | | 2002/0140068 A1 | 10/2002 | Lee |
| 6,373,127 B1 | 4/2002 | Baudouin et al. | | 2002/0140081 A1 | 10/2002 | Chou et al. |
| 6,377,464 B1 | 4/2002 | Hashemi et al. | | 2002/0158318 A1 | 10/2002 | Chen |
| 6,380,048 B1 | 4/2002 | Boon et al. | | 2002/0163015 A1 | 11/2002 | Lee et al. |
| 6,384,472 B1 | 5/2002 | Huang | | 2002/0167060 A1 | 11/2002 | Buijsman et al. |
| 6,388,336 B1 | 5/2002 | Venkateshwaran | | 2003/0006055 A1 | 1/2003 | Chien-Hung et al. |
| 6,395,578 B1 | 5/2002 | Shin et al. | | 2003/0030131 A1 | 2/2003 | Lee |
| 6,399,415 B1 | 6/2002 | Bayan et al. | | 2003/0059644 A1 | 3/2003 | Datta et al. |
| 6,400,004 B1 | 6/2002 | Fan et al. | | 2003/0064548 A1 | 4/2003 | Isaak |
| 6,410,979 B2 | 6/2002 | Abe | | 2003/0073265 A1 | 4/2003 | Hu et al. |
| 6,414,385 B1 | 7/2002 | Huang | | 2003/0102537 A1 | 6/2003 | McLellan |
| 6,420,779 B1 | 7/2002 | Sharma et al. | | 2003/0164554 A1 | 9/2003 | Fee |
| 6,421,013 B1 | 7/2002 | Chung | | 2003/0168719 A1 | 9/2003 | Cheng et al. |
| 6,429,508 B1 | 8/2002 | Gang | | 2003/0198032 A1 | 10/2003 | Collander et al. |
| 6,437,429 B1 | 8/2002 | Su et al. | | 2004/0027788 A1 | 2/2004 | Chiu |
| 6,444,499 B1 | 9/2002 | Swiss | | 2004/0056277 A1 | 3/2004 | Karnezos |
| 6,448,633 B1 | 9/2002 | Yee et al. | | 2004/0061212 A1 | 4/2004 | Karnezos |
| 6,452,279 B2 | 9/2002 | Shimoda | | 2004/0061213 A1 | 4/2004 | Karnezos |
| 6,459,148 B1 | 10/2002 | Chun-Jen et al. | | 2004/0063242 A1 | 4/2004 | Karnezos |
| 6,464,121 B2 | 10/2002 | Reijnders | | 2004/0063246 A1 | 4/2004 | Karnezos |
| 6,465,883 B2 | 10/2002 | Olofsson | | 2004/0065963 A1 | 4/2004 | Karnezos |
| 6,472,735 B2 | 10/2002 | Isaak | | 2004/0080025 A1 | 4/2004 | Kasahara |
| 6,472,743 B2 | 10/2002 | Huang et al. | | 2004/0089926 A1 | 5/2004 | Hsu et al. |
| 6,475,646 B2 | 11/2002 | Park et al. | | 2004/0164387 A1 | 8/2004 | Ikenaga et al. |
| 6,476,469 B2 | 11/2002 | Hung et al. | | 2004/0164390 A1 | 8/2004 | Wang |
| 6,476,474 B1 | 11/2002 | Hung | | 2004/0253803 A1 | 12/2004 | Tomono et al. |
| 6,482,680 B1 | 11/2002 | Khor | | 2006/0087020 A1 | 4/2006 | Hirano et al. |
| 6,483,178 B1 | 11/2002 | Chuang | | 2006/0157843 A1 | 7/2006 | Hwang |
| 6,492,718 B2 | 12/2002 | Ohmori | | 2006/0231939 A1 | 10/2006 | Kawabata et al. |
| 6,498,099 B1 | 12/2002 | McLellan et al. | | 2007/0108583 A1 | 5/2007 | Shim et al. |
| 6,498,392 B2 | 12/2002 | Azuma | | 2007/0216006 A1 | 9/2007 | Park et al. |
| 6,507,096 B2 | 1/2003 | Gang | | 2007/0216008 A1 | 9/2007 | Gerber |
| 6,507,120 B2 | 1/2003 | Lo | | 2007/0273049 A1 | 11/2007 | Khan |
| 6,518,089 B2 | 2/2003 | Coyle | | 2007/0289777 A1 | 12/2007 | Pendse |
| 6,534,849 B1 | 3/2003 | Gang | | 2007/0290319 A1 | 12/2007 | Kim |
| 6,545,332 B2 | 4/2003 | Huang | | 2007/0290376 A1 | 12/2007 | Zhao et al. |
| 6,545,345 B1 | 4/2003 | Glenn et al. | | 2008/0006942 A1 | 1/2008 | Park et al. |
| 6,552,421 B2 | 4/2003 | Kishimoto et al. | | 2008/0017967 A1 | 1/2008 | Bauer et al. |
| 6,559,525 B2 | 5/2003 | Huang | | 2008/0029858 A1 | 2/2008 | Merilo et al. |
| 6,566,168 B2 | 5/2003 | Gang | | 2008/0230887 A1 | 9/2008 | Sun et al. |
| 6,580,161 B2 | 6/2003 | Kobayakawa | | | | |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

THIN STACKED INTERPOSER PACKAGE

CROSS-REFERENCE TO RELATED APPLICATIONS

The present application is a continuation of U.S. patent application Ser. No. 11/865,617 entitled THIN STACKED INTERPOSER PACKAGE filed Oct. 1, 2007 now U.S. Pat. No. 7,777,351.

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package which is configured in a manner wherein two complimentary laminate substrate elements (i.e., a bottom element and a top element) are electrically connected to each other subsequent to one or both of the substrate elements being populated with various electronic components. Further in accordance with the present invention, there is provided a stacked wafer level chip scale package (WLCSP).

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die attach pad or die pad of the leadframe also remains exposed within the package body. In other semiconductor packages, the metal leadframe is substituted with a laminate substrate to which the semiconductor die is mounted and which includes pads or terminals for mimicking the functionality of the leads and establishing electrical communication with another device.

Once the semiconductor dies have been produced and encapsulated in the semiconductor packages described above, they may be used in a wide variety of electronic devices. The variety of electronic devices utilizing semiconductor packages has grown dramatically in recent years. These devices include cellular phones, portable computers, etc. Each of these devices typically includes a printed circuit board on which a significant number of such semiconductor packages are secured to provide multiple electronic functions. These electronic devices are typically manufactured in reduced sizes and at reduced costs, which results in increased consumer demand. Accordingly, not only are semiconductor dies highly integrated, but also semiconductor packages are highly miniaturized with an increased level of package mounting density.

Even though semiconductor packages have been miniaturized, space on a printed circuit board remains limited and precious. Thus, there is a need to find a semiconductor package design to maximize the number of semiconductor packages that may be integrated into an electronic device, yet minimize the space needed to accommodate these semiconductor packages. One method to minimize space needed to accommodate the semiconductor packages is to stack the semiconductor packages on top of each other, or to stack individual semiconductor devices or other devices within the package body of the semiconductor package. However, existing solutions for package stacking such as straddle mount laminate BGA or stacked die TSOP often do not meet form factor requirements. Therefore, a new solution is needed. The present invention is an extension of the stacking solution for space efficiency in that it is directed to, among other things, a semiconductor package which is configured in a manner wherein two complimentary laminate substrate elements (i.e., a bottom element and a top element) are electrically connected to each other subsequent to one or both of the substrate elements being populated with various electronic components. In this regard, the present invention provides a two-sided package architecture which allows topside routing (also known as a "lands-over-top" feature) while also enabling the embedding of multiple components, including but not limited to active, passive and prepackaged components. These, as well as other features and attributes of the present invention will be discussed in more detail below brief summary

BRIEF SUMMARY OF THE INVENTION

In accordance with one embodiment of the present invention, there is provided a semiconductor package comprising a bottom semiconductor package substrate which is populated with one or more electronic components. The electronic component(s) of the bottom substrate are covered or encapsulated with a suitable mold compound which hardens into a package body of the semiconductor package. The package body is provided with one or more vias through the completion of lasering or similar drilling process, such via(s) providing access to one or more corresponding conductive contacts of the bottom substrate. These vias are either lined or at least partially filled with a conductive metal material. Subsequently, a top semiconductor package substrate (an interposer) which may optionally be populated with one or more electronic components is mounted to the package body and electrically connected to the conductive metal material within the via(s) of the package body.

In accordance with another embodiment of the present invention, there is provided a semiconductor package comprising a primary semiconductor die and a secondary semiconductor die which is electrically connected to the primary semiconductor die. The secondary semiconductor die is covered or encapsulated with a suitable mold compound which hardens into a package body of the semiconductor package. The package body is provided with one or more vias through the completion of a lasering or similar drilling process, such via(s) providing access to one or more corresponding conductive pads or terminals of the primary semiconductor die other than those to which the secondary semiconductor die is electrically connected. These vias are filled with a conductive metal material.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
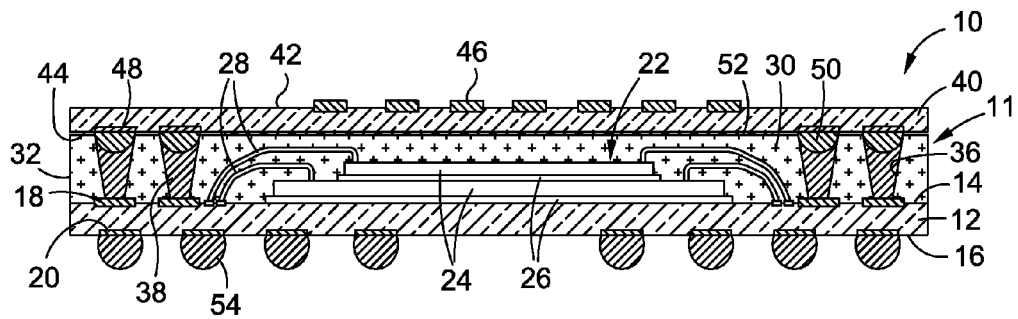
FIG. 1 is a cross-sectional view of the semiconductor package constructed in accordance with a first embodiment of the present invention.

Referring now to the drawings wherein the showings are for purposes of illustrating various embodiments of the present invention only, and not for purposes of limiting the same, FIG. 1 depicts a semiconductor package 10 constructed in accordance with a first embodiment of the present invention. The semiconductor package 10 comprises a bottom substrate assembly 11, which itself comprises a laminate bottom substrate 12 which has a generally quadrangular configuration defining four (4) peripheral edge segments. In addition, the bottom substrate 12 defines a generally planar top surface 14 and an opposed, generally planar bottom surface 16. Disposed on the top surface 14 is a plurality of top contacts 18 of the bottom substrate 12. In the bottom substrate 12, the top contacts 18 are typically disposed in relative close proximity to the peripheral edge segments defined by the bottom substrate 12. Formed on the bottom surface 16 of the bottom substrate 12 is a plurality of bottom contacts 20. Though not shown in FIG. 1, the top and bottom contacts 18, 20 are electrically connected to each other in a prescribed pattern or arrangement by conductive vias which extend through the bottom substrate 12.

Figure 4:
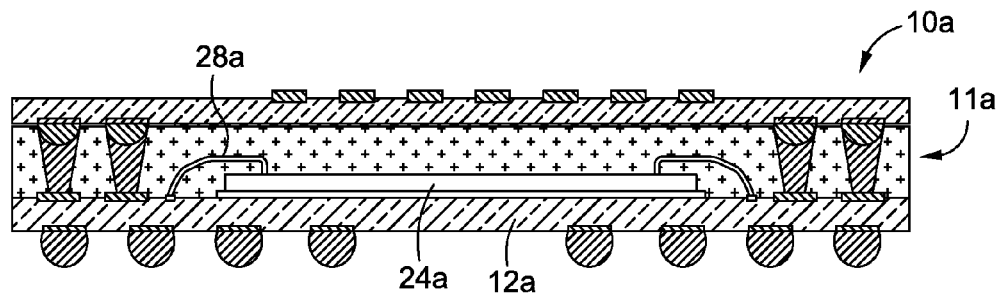
FIG. 4 is a cross-sectional view of a semiconductor package constructed in accordance with a second embodiment of the present invention.

Attached to a central area of the top surface 14 of the bottom substrate 12 is at least one electronic component of the semiconductor package 10, and more particularly a die stack 22. The die stack 22 comprises a plurality of individual semiconductor dies 24 which are arranged in a stacked configuration. In this regard, the uppermost semiconductor die 24 in the die stack 22 is secured to the semiconductor die 24 below it by a layer 26 of suitable adhesive. Similarly, the attachment of the lowermost semiconductor die 24 in the die stack 22 to the top surface 14 of the bottom substrate 12 is facilitated by an adhesive layer 26. As shown in FIG. 1, two (2) semiconductor dies 24 are depicted as being included in the die stack 22. However, those of ordinary skill in the art will recognize that the die stack 22 may be assembled to include greater than the two semiconductor dies 24 depicted in FIG. 1, or may be substituted with a single semiconductor die 24 as shown in the embodiment of FIG. 4 which will be discussed in more detail below. In the semiconductor package 10, the pads or terminals of each of the semiconductor dies 24 of the die stack 22 are electrically connected to at least some of the top contacts 18 through the use of conductive wires 28. More particularly, in the semiconductor package 10, it is contemplated that the conductive wires 28 may extend from the semiconductor dies 24 to conductive pads, traces or the like which are disposed on the top surface 14 and in turn electrically connected to the top contacts 18 in a prescribed pattern or arrangement. It is further contemplated that the conductive wires 28 can be attached directly to the top contacts 18 in a prescribed pattern or arrangement. The conductive wires 28 may be fabricated from aluminum, copper, gold, silver or a functional equivalent. Though not shown in FIG. 1, it is contemplated that the lowermost semiconductor die 24 in the die stack 22 may be electrically connected to such conductive traces on the top surface 14 of the underlying bottom substrate 12 through the use of a flip-chip type connection as an alternative to the use of the wires 28 as shown in the embodiments in FIGS. 6-9 which will also be discussed in more detail below.

In the semiconductor package 10, the die stack 22, wires 28 and portions of the top surface 14 of the bottom substrate 12 are encapsulated or covered by an encapsulant material which, upon hardening, forms a package body 30 of the semiconductor package 10. The fully formed package body 30 directly contacts the top surface 14 of the bottom substrate 12, and extends in a substantially flush relationship to the peripheral edge segments thereof. In addition, the package body 30 defines multiple, generally planar side surfaces 32, and a generally planar top surface 34. Formed within the package body 30 subsequent to the fabrication thereof is a plurality of vias 36, each of which has a generally frustoconical configuration. Each of the vias 36 extends from the top surface 34 of the package body 30 to a respective one of the top contacts 18 disposed on the top surface 14 of the bottom substrate 12. Thus, the number of vias 36 formed in the package body 30 preferably conforms to the number of top contacts 18 disposed on the top surface 14 of the bottom substrate 12. In the semiconductor package 10, each of the vias 36 is partially filled with a conductive metal material such as solder 38. Solder 38 is preferably filled into each of the vias 36 to a depth wherein the solder 38 within each via 36 terminates just below the top surface 34 of the package body 30. However, it is also contemplated that the solder 38 could extend to just above the top surface 34 of the package body 30 if the bottom substrate assembly 11 is used in conjunction with a land grid array (LGA) in lieu of the top substrate 40 which is described below. As will be recognized by those of ordinary skill in the art, the solder 38 filled into each via 36 is in direct, conductive communication with the top contact 18 disposed at the bottom of such via 36.

The semiconductor package 10 of the first embodiment further comprises a laminate top substrate 40 which is mechanically and electrically connected to the bottom substrate assembly 11 in a manner which will be described in more detail below. The top substrate 40 also has a generally quadrangular configuration defining four (4) peripheral edge segments. In addition, the top substrate 40 defines a generally planar top surface 42 and an opposed, generally planar bottom surface 44. Disposed in the approximate center of the top surface 42 of the top substrate 40 is a plurality of top contacts 46 of the top substrate 40. Those of ordinary skill in the art will recognize that the top contacts 46 may be provided anywhere on the top surface 42, the depicted placement in the central region thereof constituting one exemplary placement. Additionally, formed on the bottom surface 44 of the top substrate 40 is a plurality of bottom contacts 48 thereof. In the top substrate 40, the bottom contacts 48 are typically disposed in relative close proximity to the peripheral edge segments defined by the top substrate 40. Though not shown, the top and bottom contacts 46, 48 are electrically connected to each other by conductive vias which extend through the top substrate 40. Those of ordinary skill in the art will recognize that each top contact 46 may be electrically connected to one or more bottom contacts 48 in any pattern or arrangement through the use of such conductive vias. Formed on each bottom contact 48 of the top substrate 40 is a solder ball 50 which is used to facilitate the electrical connection of the top substrate 40 to the bottom substrate assembly as will be described below. Though the top substrate 40 is shown as being approximately the same size as the bottom substrate assembly 11, those of ordinary skill in the art will recognize that the top substrate 40 can also be larger or smaller than the bottom substrate assembly 11. Additionally, as indicated above, the top substrate 40 could be substituted with an LGA substrate, or could include a stud bump made from aluminum or copper wire.

In the semiconductor package 10, each solder ball 50 attached to a respective bottom contact 48 of the top substrate 40 is advanced into a respective one of the vias 36 formed in the package body 30 of the bottom substrate assembly 11. As will be recognized by those of ordinary skill in the art, such advancement is limited by the abutment of each solder ball 50 against the solder 38 filled into the corresponding via 36. When such abutment occurs, a slight gap will typically be defined between the top surface 34 of the package body 30 and the bottom surface 44 of the top substrate 40. The subsequent completion of a solder reflow process effectively mechanically and electrically connects the solder balls 50 of the top substrate 40 to the solder 38 in respective ones of the vias 36, thereby electrically connecting the bottom contacts 48 of the top substrate 40 to respective ones of the top contacts 18 of the bottom substrate 12. The reflow of the solder balls 50 and solder 38 will typically cause the bottom surface 44 of the top substrate 40 to either contact or be disposed in extremely close proximity to the top surface 34 of the package body 30. As further seen in FIG. 1, it is contemplated that an adhesive layer 52 may be interposed between the top surface 34 of the package body 30 and the bottom surface 44 of the top substrate 40 to strengthen the mechanical interconnection therebetween.

In the semiconductor package 10, the bottom substrate assembly 11 and the top substrate 40 are preferably sized and configured relative to each other such that when the top substrate 40 is electrically and mechanically connected to the bottom substrate assembly 11 in the above-described manner, the peripheral edge segments of the top substrate 40 extend in generally co-planar relation to respective ones of the peripheral edge segments of the bottom substrate 12. Similarly, the peripheral edge segments of the bottom and top substrates 12, 40 extend in generally flush, co-planar relation to respective ones of the side surfaces 32 of the package body 30. Further, when the top substrate 40 is electrically and mechanically connected to the bottom substrate assembly 11, the die stack 22 as well as the conductive wires 28 are also effectively positioned between the bottom and top substrates 12, 40, and more particularly the top surface 14 of the bottom substrate 12 and the bottom surface 44 of the top substrate 40. In the semiconductor package 10, the top contacts 46 of the top substrate 40 provide top side routing also know as a "lands-over-top" feature. Additionally, it is contemplated that each of the bottom contacts 20 of the bottom substrate 12 will include a solder ball 54 formed thereon to facilitate the electrical and mechanical connection of the semiconductor package 10 to an underlying substrate such as a printed circuit board. Additionally, it is contemplated that the bottom substrate 12 could be substituted with a land grid array (LGA) substrate.

Figure 2A:
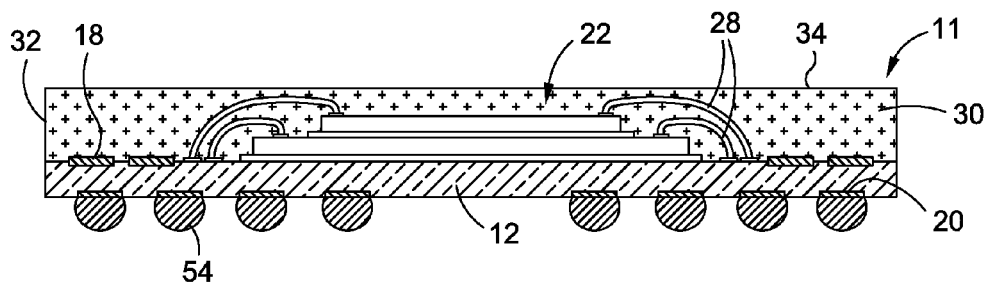
FIGS. 2A-2C illustrate an exemplary sequence of steps which may be used to facilitate the fabrication of the bottom substrate assembly of the semiconductor package shown in FIG. 1.
Figure 2B:
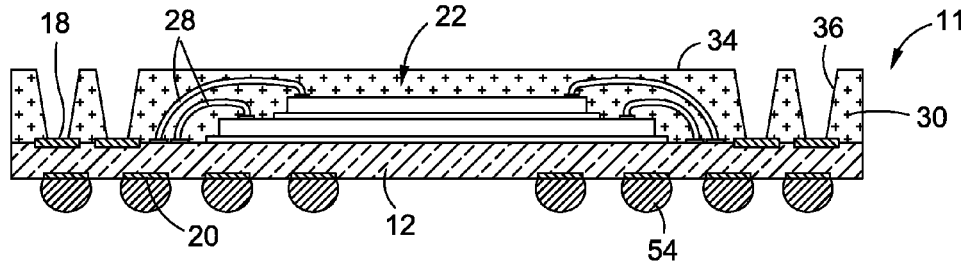
Figure 2C:
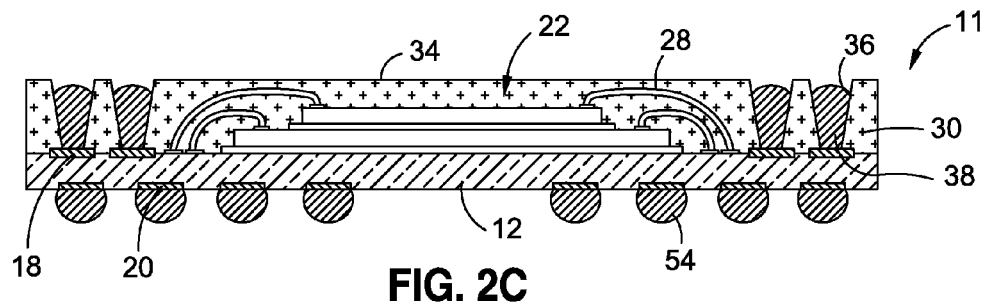

FIGS. 2A-2C illustrate an exemplary sequence of steps which may be utilized to facilitate the fabrication of the bottom substrate assembly 11 of the semiconductor package 10. In the initial step of the fabrication process shown in FIG. 2A, the die stack 22 is mounted and electrically connected to the bottom substrate 12 in the above-described manner, with the package body 30 thereafter being formed over the die stack 22, wires 28 and top surface 14 of the bottom substrate 12. A laser drilling process is then completed in the manner shown in FIG. 2B to facilitate the formation of the vias 36 in the package body 30 in the above-described manner. In this regard, as previously explained, the vias 36 are oriented so as to extend form the top surface 34 of the package body 30 to respective ones of the top contacts 18 of the bottom substrate 12. Subsequent to the formation of the vias 36, each such via 36 is partially filled with the solder 38 as shown in FIG. 2C and in the manner also described above. The partial filling of the vias 36 with the solder 38 completes the fabrication of the bottom substrate assembly 11. As an alternative to the use of the above-described lasering process to facilitate the formation of the vias 36, it is contemplated that such vias 36 may be created by forming the package body 30 through the use of a special mold tool. More particularly, such mold tool is outfitted with a plurality of pins which engage respective ones of the top contacts 18 and are sized and oriented to define respective ones of the vias 36. Alternatively, the pins of the mold tool may be sized and configured so as not to engage the top contacts 18 and thus only partially define the vias 36. In this case, a lasering process is subsequently conducted to remove portions of the package body 30 as needed to complete the extension of each of the partially formed vias 36 to respective ones of the top contacts 18.

Figure 3A:
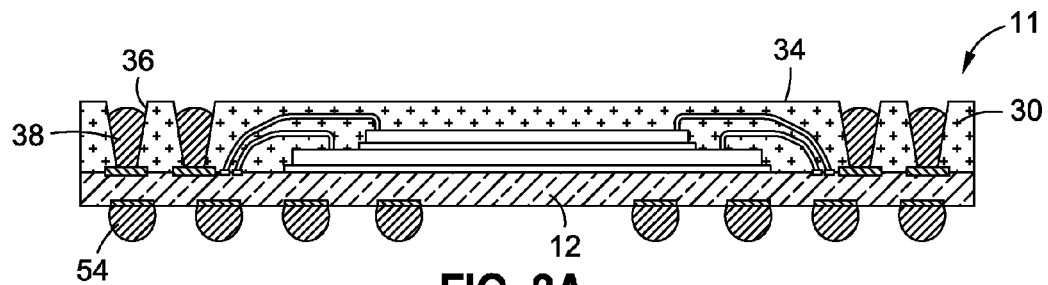
FIGS. 3A-3D illustrate an exemplary sequence of steps which may be used to fabricate the semiconductor package shown in FIG. 1.
Figure 3B:
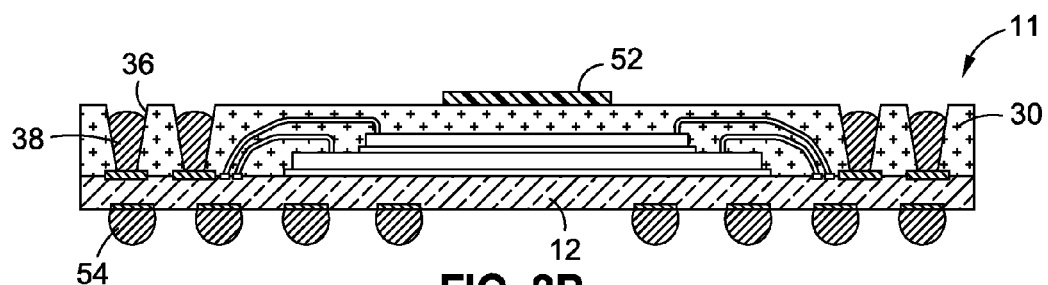
Figure 3C:
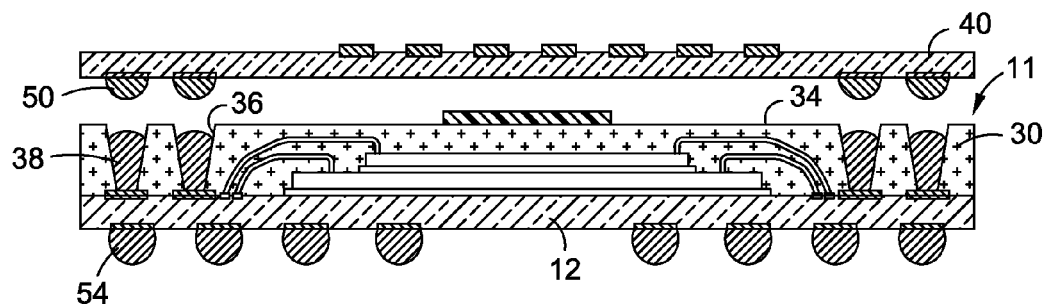
Figure 3D:
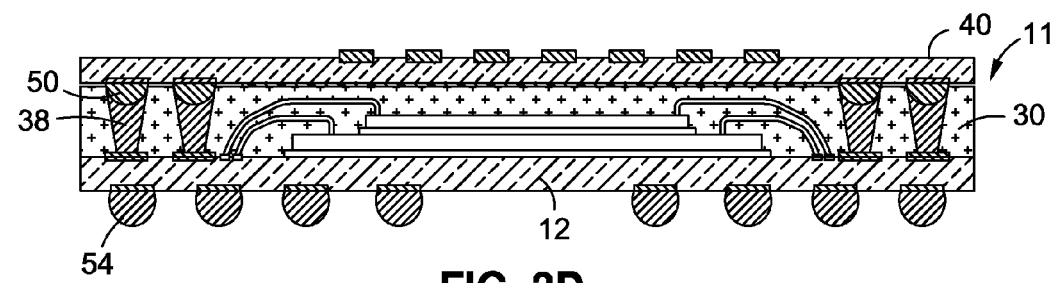

FIGS. 3A-3D illustrate an exemplary sequence of steps which may be used to facilitate the complete fabrication of the semiconductor package 10 shown in FIG. 1. In the initial step of the fabrication process shown in FIG. 3A, the bottom substrate assembly 11 is provided, such bottom substrate assembly 11 being fabricated in the manner described in FIGS. 2A-2C above. As shown in FIG. 3B, the adhesive layer 52 (e.g. an epoxy) is then dispensed upon a central portion of the top surface 34 of the package body 30 of the bottom substrate assembly 11. Thereafter, as shown in FIG. 3C, the solder balls 50 formed on the bottom contacts 48 of the top substrate 40 are advanced into respective ones of the vias 36 in the above-described manner so as to abut the solder 38 in such vias. As indicated above, the abutment of the solder balls 50 against the solder 38 in respective ones of the vias 36 typically results in a gap or space being defined between the bottom surface 44 of the top substrate 40 and the top surface 34 of the package body 30. As shown in FIG. 3D, the subsequent completion of a solder reflow process effectively mechanically and electrically connects the solder balls 50 to the solder 38 in respective ones of the vias 36, thus placing each of the bottom contacts 48 of the top substrate 40 into electrical communication with respective ones of the top contacts 18 of the bottom substrate assembly 11. Though, for purposes of clarity, FIGS. 1 and 3D depict the solder balls 50 and solder 38 as separate elements, those of ordinary skill in the art will recognize that the completion of the aforementioned reflow process effectively combines the solder balls 50 and solder 38 into a continuous column. The same holds true for the depictions in FIGS. 4 and 5 described below.

Referring now to FIG. 4, there shown a semiconductor package 10a constructed in accordance with a second embodiment of the present invention. The semiconductor package 10a is substantially similar in construction to the semiconductor package 10 described above, with the sole distinction between the semiconductor packages 10, 10a lying in the semiconductor package 10a including only a single semiconductor die 24a mounted and electrically connected to the bottom substrate 12a of the bottom substrate assembly 11a. The inclusion of the single semiconductor die 24a in the semiconductor package 10a is in contrast to the die stack 22 having the stacked semiconductor dies 24 which is included in the semiconductor package 10.

Figure 5:
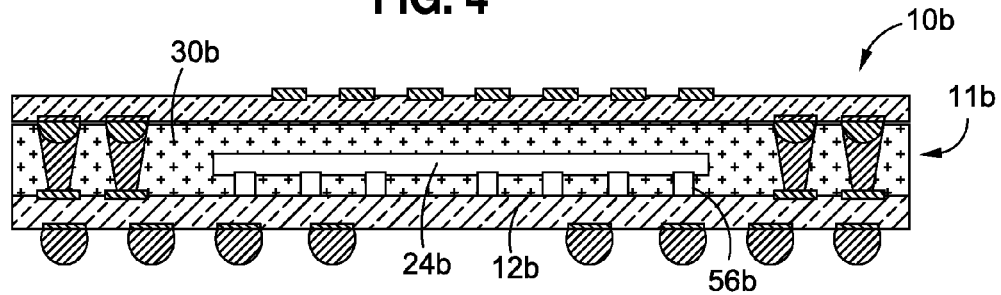
FIG. 5 is a cross-sectional view of a semiconductor package constructed in accordance with a third embodiment of the present invention.
Figure 6:
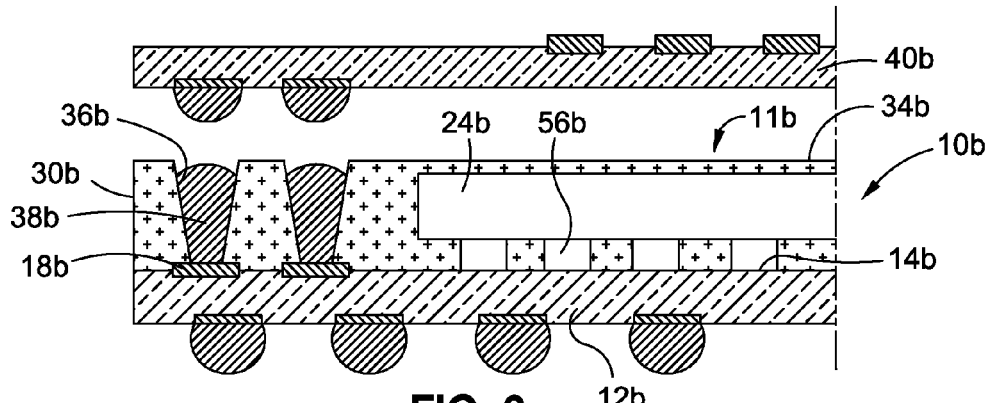
FIG. 6 is an exploded, partial cross-sectional view of the semiconductor package shown in FIG. 5.

Referring now to FIGS. 5 and 6, there shown a semiconductor package 10b constructed in accordance with a third embodiment of the present invention. The semiconductor package 10b is substantially similar to the semiconductor package 10a shown in FIG. 4, except that the single semiconductor die 24b of the semiconductor package 10b is electrically connected to the bottom substrate 12b through the use of a flip-chip type connection, as opposed to the use of the conductive wires 28a used in conjunction with the semiconductor die 24a in the semiconductor package 10a. More particularly, in the semiconductor package 10b, conductive posts 56b which may be made of copper or a similar, suitable conductive material are used to electrically connect pads or terminals of the semiconductor die 24b to corresponding pads or traces of the bottom substrate 12b which are in turn electrically connected to the top contacts 18b thereof in a prescribed pattern or arrangement. Those of ordinary skill in the art will recognize that solder balls may also be used as an alternative to the conductive posts 56b. In FIG. 6, the solder 38b filled into each of the vias 36b in the package body 30b of the bottom substrate assembly 11b is clearly depicted, as is the direct engagement between the solder 38b in each via 36b and a respective one of the top contacts 18b included on the top surface 14b of the substrate 12b. Though not shown in FIGS. 5 and 6, it is contemplated that the top surface of the semiconductor die 24b could be exposed in the top surface 34b of the package body 30b rather than being covered by the package body 30b to reduce the overall thickness of the bottom substrate assembly 11b.

Figure 7:
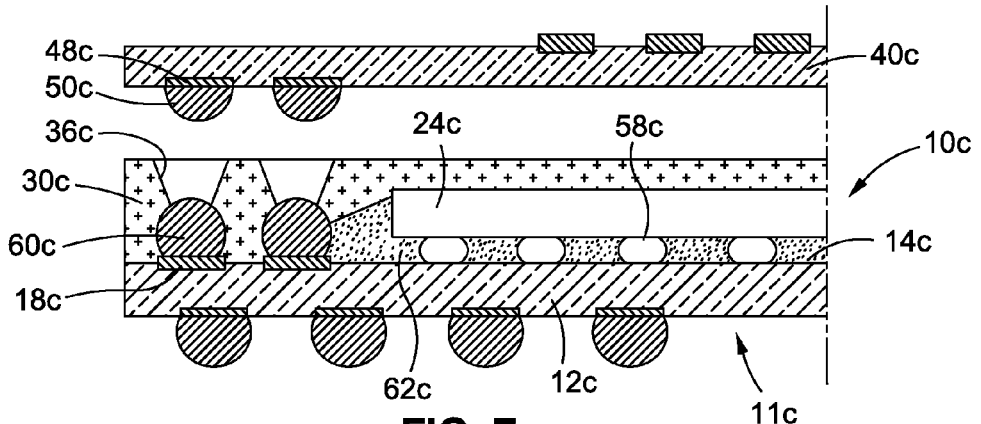
FIG. 7 is an exploded, partial cross-sectional view of a semiconductor package constructed in accordance with a fourth embodiment of the present invention.

Referring now to FIG. 7, there shown a semiconductor package 10c constructed in accordance with a fourth embodiment of the present invention. The semiconductor package 10c is similar to the semiconductor package 10b described above in relation to FIGS. 5 and 6, with one distinction between the semiconductor packages 10b, 10c lying in the substitution of the conductive posts 56b of the semiconductor package 10b with the solder balls 58c included in the semiconductor package 10c. In this regard, the solder balls 58c are used to facilitate the electrical connection of the sole semiconductor die 24c included in the semiconductor package 10c to the bottom substrate 12c thereof. More particularly, in the semiconductor package 10c, the solder balls 58c are used to electrically connect pads or terminals of the semiconductor die 24b to corresponding pads or traces of the bottom substrate 12c which are in turn electrically connected to the top contacts 18c thereof in a prescribed pattern or arrangement.

A further distinction between the semiconductor packages 10b, 10c lies in the formation of solder balls 60c upon each of the top contacts 18c disposed on the top surface 14c of the substrate 12c. As is seen in FIG. 7, due to the formation of the solder balls 60c upon respective ones of the top contacts 18c, the vias 36c formed in the package body 30c of the bottom substrate assembly 11c extend to respective ones of such solder balls 60c, as opposed to extending to respective ones of the top contacts 18c. Along these lines, in contrast to the semiconductor package 10b wherein solder 38b is partially filled into each of the vias 36b, no solder is filled into each of the vias 36c in the semiconductor package 10c. In this regard, subsequent to the advancement of the solder balls 50c of the top substrate 40c into respective ones of the vias 36c, the completion of a solder reflow process effectively fuses the solder balls 50c to respective ones of the solder balls 60c as effectively places the bottom contacts 48c of the top substrate 40c into electrical communication with respective ones of the top contacts 18c of the bottom substrate 12c. As is further shown in FIG. 7, when the solder balls 58c are used to facilitate the electrical connection of the semiconductor die 24c to the bottom substrate 12c, an underfill material 62c is typically included in the bottom substrate assembly 11c, such underfill material 62c flowing about the solder balls 58c between the semiconductor die 24c and the top surface 14c of the bottom substrate 12c.

Figure 8:
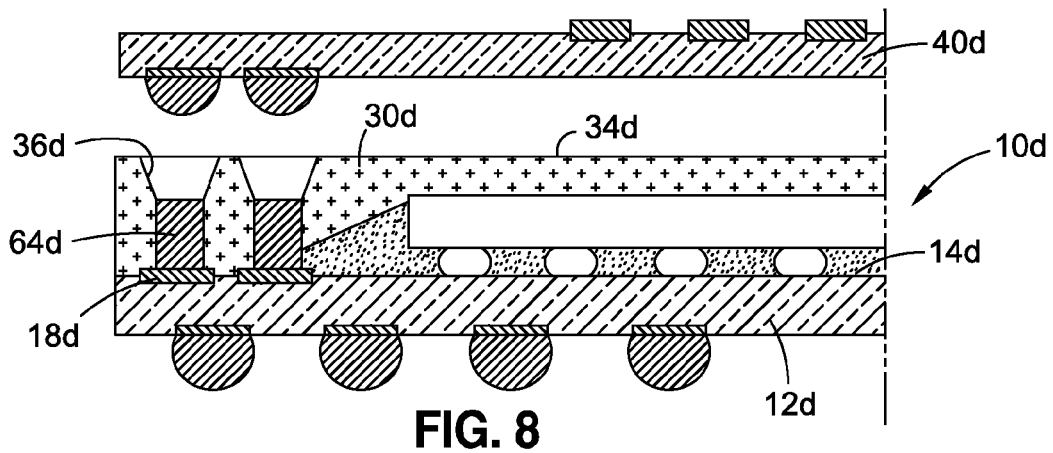
FIG. 8 is an exploded, partial cross-sectional view of a semiconductor package constructed in accordance with a fifth embodiment of the present invention.

Referring now to FIG. 8, there shown a semiconductor package 10d which is constructed in accordance with a fifth embodiment of the present invention. The semiconductor package 10d is substantially similar to the semiconductor package 10c described above in relation to FIG. 7, with the sole distinction lying in the substitution of the solder balls 60c of the semiconductor package 10c with conductive posts 64d in the semiconductor package 10d. In this regard, in the semiconductor package 10d, the conductive posts 64d are formed on respective ones of the top contacts 18d disposed on the top surface 14d of the substrate 12d. Additionally, the vias 36d formed in the package body 30d extend from the top surface 34d to respective ones of the conductive posts 64d. The conductive posts 64d of the semiconductor package 10d are each preferably fabricated from a conductive metal material, such as copper. The conductive posts 64d may be soldered to respective ones of the top contacts 18d.

Figure 9:
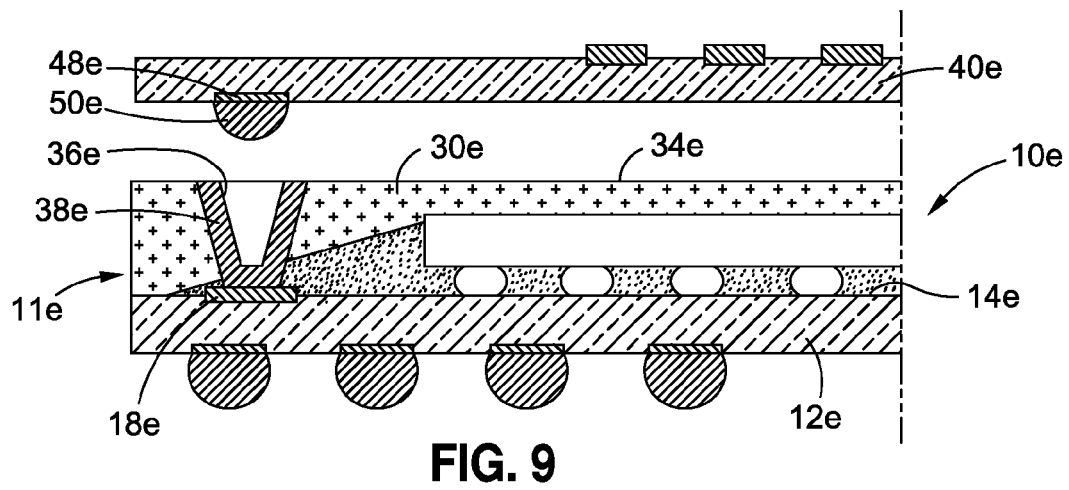
FIG. 9 is an exploded, partial cross-sectional view of a semiconductor package constructed in accordance with a sixth embodiment of the present invention.

Referring now to FIG. 9, there shown a semiconductor package 10e which is constructed in accordance with a sixth embodiment of the present invention. The semiconductor package 10e is similar to the above-described semiconductor packages 10c, 10d shown in FIGS. 7 and 8, respectively, with the primary distinction lying in the elimination of the above-described solder balls 60c and conductive posts 64d in the semiconductor package 10e. More particularly, in the semiconductor package 10e, the vias 36e extend all the way to respective ones of the top contacts 18e disposed on the top surface 14e of the substrate 12e. However, rather than each of the vias 36e being partially filled with solder similar to the partial filling of the vias 36b with solder 38b in the semiconductor package 10b shown and described above in relation to FIGS. 5 and 6, the sidewall of each of the vias 36e in the semiconductor package 10e is only plated with a conductive metal material. As further seen in FIG. 9, the conductive plating 38e of each via 36e extends from the top surface 34e of the package body 30e and covers that portion of the corresponding top contact 18e which is exposed at the bottom of the via 36e. As will be recognized by those of ordinary skill in the art, when the solder balls 50e of the top substrate 40e of the semiconductor package 10e are advanced into respective ones of the vias 36e to facilitate the mechanical and electrical connection of the top substrate 40e to the bottom substrate assembly 11e, the subsequent completion of a solder reflow process effectively fuses the solder balls 50e to the conductive plating 38e of respective ones of the vias 36e, thus in turn electrically connecting the bottom contacts 48e of the top substrate 40e to respective ones of the top contacts 18e of the bottom substrate 12e.

Figure 10:
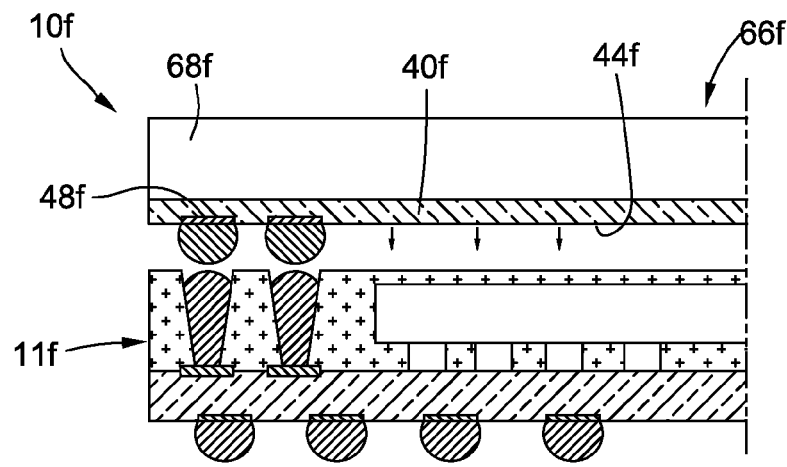
FIG. 10 is an exploded, partial cross-sectional view of a semiconductor package constructed in accordance with a seventh embodiment of the present invention.

Referring now to FIG. 10, there shown a semiconductor package 10f constructed in accordance with a seventh embodiment of the present invention. The semiconductor package 10f is similar in construction to the semiconductor package 10b described above in relation to FIG. 6, except that the top substrate 40b of the semiconductor package 10b is substituted with a top substrate assembly 66f in the semiconductor package 10f. The top substrate assembly 66f is mechanically and electrically connected to the bottom substrate assembly 11f, which is itself identically configured to the bottom substrate assembly 11b of the semiconductor package 10b. The top substrate assembly 66f comprises a top substrate 40f which is substantially similar to the top substrate 40 of the semiconductor package 10, except that one or more electronic components such as semiconductor dies, passive devices and the like are mounted to the top surface of the top substrate 40f and electrically connected to the bottom contacts 48f disposed on the bottom surface 44f of the top substrate 40f in a prescribed pattern or arrangement. The electronic component(s) mounted to the top surface of the top substrate 40f are covered or encapsulated by a package body 68f of the top substrate assembly 66f. Thus, the top substrate assembly 66f has the general structural and functional attributes of a conventional BGA (ball grid array) semiconductor package. Those of ordinary skill in the art will recognize that a ball grid array semiconductor package like the top substrate assembly 66f included in the semiconductor package 10f may be substituted for the top substrates 40, 40a, 40b, 40c, 40d and 40e described in relation to each of the semiconductor packages 10, 10a, 10b, 10c, 10d, 10e.

Figure 11:
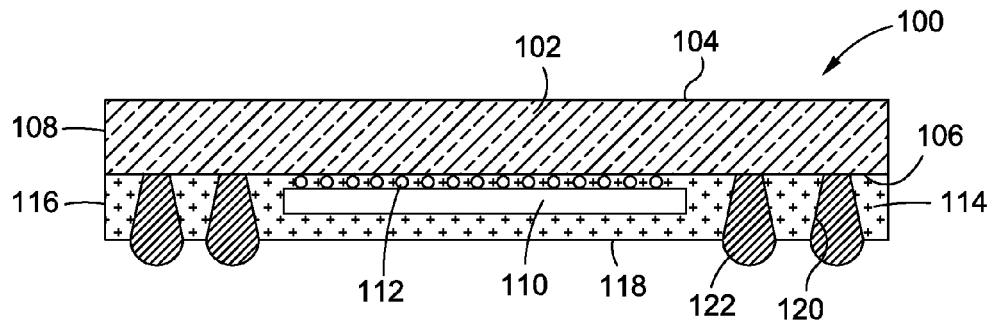
FIG. 11 is a cross-sectional view of a semiconductor package constructed in accordance with an eighth embodiment of the present invention.

Referring now to FIG. 11, there shown a semiconductor package 100 constructed in accordance with an eighth embodiment of the present invention. The semiconductor package 100 comprises a primary semiconductor die 102 which has a generally quadrangular configuration. In this regard, the primary semiconductor die 102 defines a generally planar top surface 104, an opposed generally planar bottom surface 106, and a plurality of generally planar side surfaces 108 which extend generally perpendicularly between the top and bottom surfaces 104, 106. Disposed on the bottom surface 106 of the primary semiconductor die 102 is a plurality of conductive pads or terminals.

In addition to the primary semiconductor die 102, the semiconductor package 100 comprises a secondary semiconductor die 110 which also has a generally quadrangular configuration. Conductive pads or terminals of the secondary semiconductor die 110 are electrically connected to respective ones of the pads or terminals of the primary semiconductor die 102 through the use of solder balls 112, as shown FIG. 11.

In the semiconductor package 100, subsequent to the electrical connection of the secondary semiconductor die 110 to the primary semiconductor die 102 through the use of the solder balls 112, the secondary semiconductor die 110, solder balls 112, and bottom surface 106 of the primary semiconductor die 102 are encapsulated or covered by an encapsulant material or molding compound which, upon hardening, forms a package body 114 of the semiconductor package 100. The fully formed package body 114 directly contacts the bottom surface 106 of the primary semiconductor die 102 and defines multiple, generally planar side surfaces 116 which extend in generally flush, co-planar relation to respective ones of the side surfaces 108 of the primary semiconductor die 102. In addition, the package body 114 defines a generally planar bottom surface 118.

In the semiconductor package 100, vias 120 are formed in the package body 114, with each of the vias 120 extending from the bottom surface 118 to a respective one of the conductive pads or terminals disposed on the bottom surface 106 of the primary semiconductor die 102. Like the vias 36 described above in relation to the semiconductor package 10, each of the vias 120 preferably has a generally frusto-conical configuration, and is formed by the completion of a laser drilling or similar process. In the semiconductor package 100, each of the vias 120 is completely filled with a solder ball 122. More particularly, each solder ball 122 directly contacts a respective one of the pads or terminals of the primary semiconductor die 102, and includes a portion which protrudes outwardly beyond the bottom surface 118 of the package body 114 as shown in FIG. 11. As will be recognized by those of ordinary skill in the art, the protruding portions of the solder balls 122 are used to facilitate the electrical connection of the semiconductor package 100 to an underlying substrate such as a printed circuit board.

Figure 12:
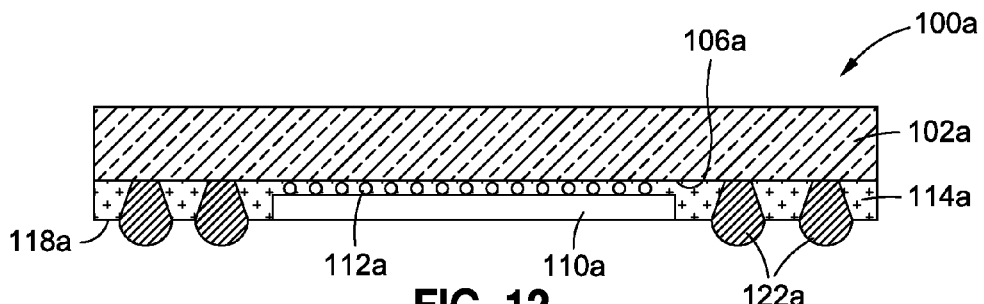
FIG. 12 is a cross-sectional view of a semiconductor package constructed in accordance with a ninth embodiment of the present invention.

Referring now to FIG. 12, there shown a semiconductor package 100a constructed in accordance with a ninth embodiment of the present invention. The semiconductor package 100a is substantially similar to the semiconductor package 100 described above in relation to FIG. 11, with the primary distinction lying in the package body 114a of the semiconductor package 100a being formed to be of a reduced thickness in comparison to the package body 114. As a result of the formation of the package body 114a with a reduced thickness in comparison to the package body 114, that surface of the secondary semiconductor die 110a of the semiconductor package 100a opposite that having the solder balls 112a applied thereto and disposed closest to the bottom surface 106a of the primary semiconductor die 102a is exposed in and substantially flush with the bottom surface 118a of the package body 114a. As is further seen in FIG. 12, the reduced thickness of the package body 114a also causes the solder balls 122a of the semiconductor package 100a to be smaller than the solder balls 122 included in the semiconductor package 100.

Figure 13:
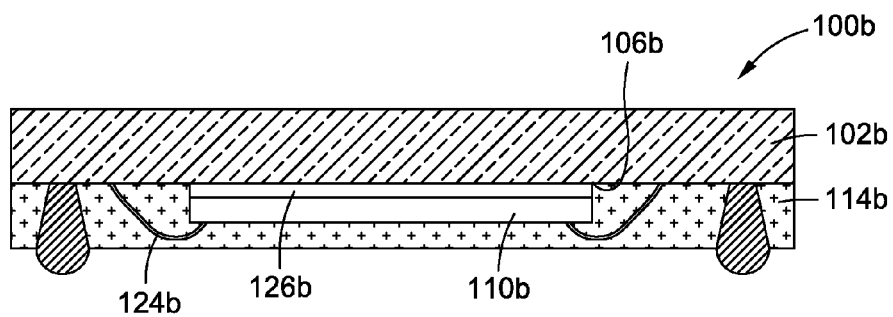
FIG. 13 is a cross-sectional view of a semiconductor package constructed in accordance with a tenth embodiment of the present invention.

Referring now to FIG. 13, there shown a semiconductor package 100b constructed in accordance with a tenth embodiment of the present invention. The semiconductor package 100b is also similar in construction to the semiconductor package 100 shown and described above in relation to FIG. 11, with the primary distinction lying in the secondary semiconductor die 110b of the semiconductor package 100b being electrically connected to corresponding pads or terminals on the bottom surface 106b of the primary semiconductor die 102b through the use of conductive wires 124b as opposed to the use of the solder balls 112 described above in relation to the semiconductor package 100. Each of the conductive wires 124b extends from a pad or terminal of the secondary semiconductor die 110b to a corresponding pad or terminal on the bottom surface 106b of the primary semiconductor die 102b. Additionally, in the semiconductor package 100b, that surface of the secondary semiconductor die 110b opposite that to which the conductive wire 124b extend is itself secured to a central portion of the bottom surface 106b of the primary semiconductor die 102b though the use of an adhesive layer 126b. In the semiconductor package 100b, the secondary semiconductor die 110b, conductive wires 124b, and adhesive layer 126b are each covered by the package body 114b thereof.

Figure 14:
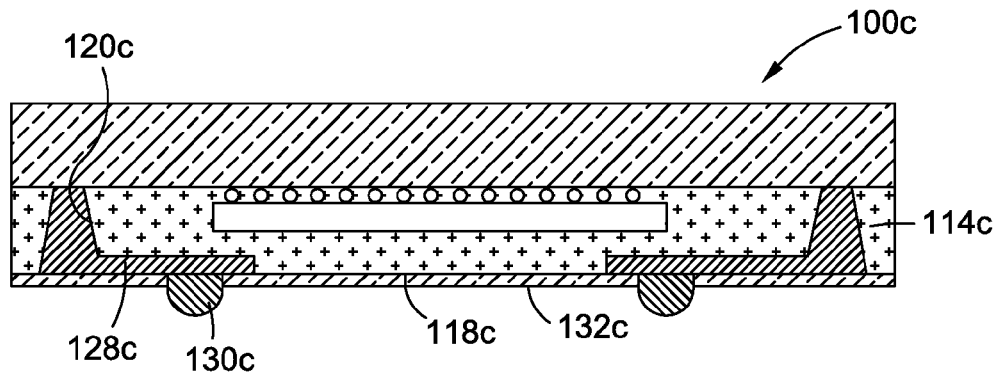
FIG. 14 is a cross-sectional view of a semiconductor package constructed in accordance with an eleventh embodiment of the present invention.

Referring now to FIG. 14, there shown a semiconductor package 100c constructed in accordance with an eleventh embodiment of the present invention. The semiconductor package 100c is similar in structure to the semiconductor package 100 shown and described above in relation to FIG. 11. However, in the semiconductor package 100c, each of the vias 120c is not filled with a solder ball such as the solder ball 122 described in relation to the semiconductor package 100. Rather, each via 120c in the semiconductor package 100c is filled or lined with a conductive metal material (e.g., copper). Also included in the semiconductor package 100c is a plurality of conductive traces 128c which are embedded in the bottom surface 118c of the package body 114c. Each of the traces 128c, which may also be fabricated from copper, is integrally connected to the copper material filled into a respective one of the vias 120c. In fabricating the semiconductor package 100c, a laser is preferably used to ablate trenches into the bottom surface 118c of the package body 114c, such trenches being sized and configured to accommodate respective ones of the traces 128c. Additionally, formed on each of the traces 128c is a solder ball 130c which is to facilitate the electrical connection of the semiconductor package 100c to an underlying substrate such as a printed circuit board. In the semiconductor package 100c, the exposed portions of the bottom surface 118c of the package body 114c and traces 128c, as well as portions of each of the solder balls 130c, may be covered by a layer 132c of a solder mask or polymer flux.

Figure 15:
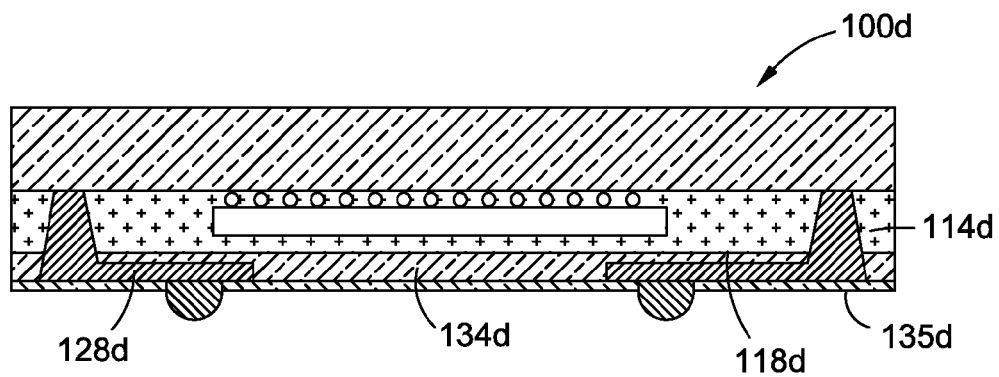
FIG. 15 is a cross-sectional view of a semiconductor package constructed in accordance with a twelfth embodiment of the present invention.

Referring now to FIG. 15, there shown a semiconductor package 100d constructed in accordance with a twelfth embodiment of the present invention. The semiconductor package 100d is substantially similar to the semiconductor package 100c shown and described above in relation to FIG. 14. In this regard, the primary distinction between the semiconductor packages 100c, 100d lies in the traces 128d of the semiconductor package 100d being embedded in a build-up layer 134d of the semiconductor package 100d, as opposed to being embedded in the bottom surface 118d of the package body 114d thereof. In this regard, the build-up layer 134d is applied directly to the bottom surface 118d of the package body 114d. The build-up layer 134d and exposed portions of the conductive traces 128d are each covered by a solder mask layer 135d.

Figure 16:
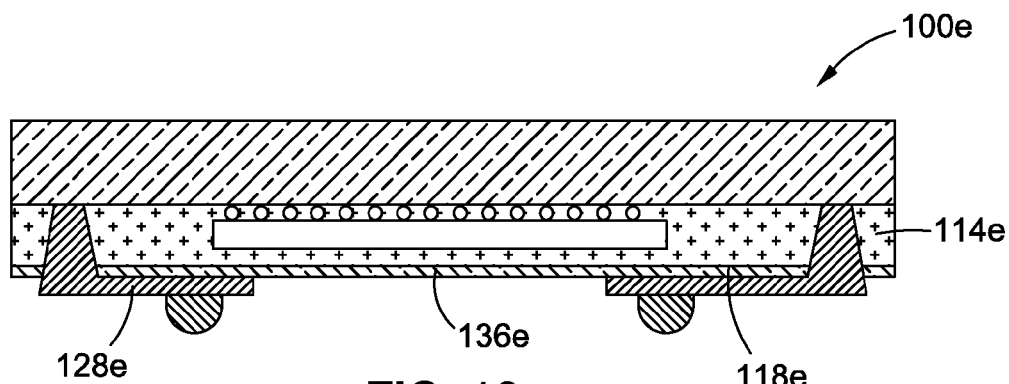
FIG. 16 is a cross-sectional view of a semiconductor package constructed in accordance with a thirteenth embodiment of the present invention.

Referring now to FIG. 16, there shown a semiconductor package 100e constructed in accordance with a thirteenth embodiment of the present invention. The semiconductor package 100e is substantially similar in structure to the semiconductor package 100d shown and described above in relation to FIG. 15. In this regard, the primary distinction between the semiconductor packages 100d, 100e lies in the substitution of the build-up layer 134d of the semiconductor package 100d with a dielectric layer 136e in the semiconductor package 100e. The dielectric layer 136e is applied to the bottom surface 118e of the package body 114e in the semiconductor package 100e. The conductive traces 128e of the semiconductor package 100e are not embedded in the dielectric layer 136e, but rather are applied to the outer surface thereof as shown in FIG. 16. Though not shown in FIG. 16, it is contemplated that a solder mask layer may be applied over the conductive traces 128e and dielectric layer 136e, similar to the solder mask layer 135d shown in FIG. 15.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a bottom substrate including:
   a plurality of first contacts, at least some of the first contacts of the bottom substrate each having a solder ball which is of a first maximum diameter disposed thereon; and
   a plurality of second contacts, each of the second contacts of the bottom substrate being electrically connected to at least one of the first contacts thereof;
   at least one electronic component attached to the bottom substrate and electrically connected to at least one the first contacts;
   a package body at least partially encapsulating the bottom substrate and the electronic component, the package body including a plurality of vias disposed therein and extending to respective ones of the solder balls of the bottom substrate; and
   a top substrate including:
   a plurality of first contacts; and
   a plurality of second contacts, each of the first contacts of the top substrate being electrically connected to at least one of the second contacts thereof;
   at least some of the second contacts of the top substrate each having a solder ball which is of a second maximum diameter substantially equal to the first maximum diameter disposed thereon, the solder balls of the top substrate being mechanically and electrically connected to respective ones of the solder balls of the bottom substrate, with the vias being sized and configured to accommodate the advancement of the solder balls on the top substrate therein to a depth wherein the top substrate is disposed in extremely close proximity to the package body.

2. The semiconductor package of claim 1 wherein the electronic component is electrically connected to at least some of the first contacts of the bottom substrate by solder balls.

3. The semiconductor package of claim 1 wherein:
each of the second contacts of the top substrate has a solder ball disposed thereon; and
each of the solder balls of the top substrate is mechanically and electrically connected to a respective one of the solder balls of the bottom substrate in a respective one of the vias.

4. The semiconductor package of claim 1 wherein each of the vias is sized and configured to accommodate the advancement of the solder balls on the top substrate therein to a depth wherein the top substrate contacts the package body.

5. The semiconductor package of claim 1 wherein the electronic component comprises at least one semiconductor die which is electrically connected to at least some of the first contacts of the bottom substrate by solder balls which are covered by a layer of underfill material disposed between the package body and the bottom substrate.

6. The semiconductor package of claim 1 wherein:
each of the second contacts of the top substrate has a solder ball disposed thereon;
each of the first contacts of the bottom substrate has a solder ball disposed thereon;
each of the vias extends to a respective one of the solder balls disposed on the first contacts of the bottom substrate; and
each of the solder balls of the top substrate is mechanically and electrically connected to a respective one of the solder balls of the bottom substrate in a respective one of the vias.

7. The semiconductor package of claim 1 wherein each of the vias has a generally frusto-conical configuration.

8. A semiconductor package comprising:
a bottom substrate including:
a plurality of first contacts, at least some of the first contacts of the bottom substrate each having a non-spherical conductive post disposed thereon; and
a plurality of second contacts, each of the second contacts of the bottom substrate being electrically connected to at least one of the first contacts thereof;
at least one electronic component attached to the bottom substrate and electrically connected to at least one of the first contacts;
a package body at least partially encapsulating the bottom substrate and the electronic component, the package body including a plurality of vias disposed therein and extending to respective ones of the conductive posts of the bottom substrate; and
a top semiconductor package including a plurality of contacts which each have a solder ball disposed thereon, each of the solder balls of the top semiconductor package being mechanically and electrically connected to the conductive post in a respective one of the vias which are sized and configured to accommodate the advancement of the solder balls on the top semiconductor package therein to a depth wherein the top semiconductor package contacts the package body.

9. The semiconductor package of claim 8 wherein the top semiconductor package comprises a ball grid array device.

10. The semiconductor package of claim 8 wherein the electronic component comprises at least one semiconductor die which is electrically connected to at least some of the top contacts of the bottom substrate by solder balls.

11. The semiconductor package of claim 8 wherein each of the conductive posts has a substantially cylindrical configuration and is of a height which exceeds a diameter thereof.

12. A semiconductor package comprising:
a substrate including a plurality of first contacts and a plurality of second contacts disposed thereon, each of the second contacts being electrically connected to at least one of the first contacts, and each of the first contacts having a solder ball disposed thereon;
at least one electronic component attached to the substrate and electrically connected to at least one of the first contacts; and
a package body at least partially encapsulating the substrate and the electronic component, the package body including a plurality of vias disposed therein and extending to respective ones of the solder balls, the vias being sized and configured to accommodate the advancement of solder balls on a second semiconductor package therein to a depth wherein the second semiconductor package will contact the package body when the solder balls on the second semiconductor package are mechanically and electrically connected to respective ones of the solder balls of the semiconductor package within respective ones of the vias.

13. A semiconductor package comprising:
a bottom substrate including a plurality of contacts, at least some of the contacts having solder balls disposed thereon which are each of a first maximum diameter; and
at least one electronic component attached to the bottom substrate and electrically connected to at least one the contacts thereof;
a package body at least partially encapsulating the bottom substrate and the electronic component, the package body including a plurality of vias disposed in therein and extending to respective ones of the solder balls of the bottom substrate; and
a top substrate including a plurality of contacts, at least some of the contacts of the top substrate each having a solder ball which is of a second maximum diameter substantially equal to the first maximum diameter disposed thereon, the solder balls of the top substrate being mechanically and electrically connected to respective ones of the solder balls of the bottom substrate, with the vias being sized and configured to accommodate the advancement of the solder balls on the top substrate therein to a depth wherein the top substrate is disposed in extremely close proximity to the package body.

14. The semiconductor package of claim 13 wherein the electronic component comprises at least one semiconductor die which is electrically connected to at least some of the contacts of the bottom substrate by solder balls which are covered by a layer of underfill material disposed between the package body and the bottom substrate.

15. The semiconductor package of claim 13 wherein:
each of the contacts of the top substrate have solder balls disposed thereon; and
each of the solder balls of the top substrate is mechanically and electrically connected to a respective one of the solder balls of the bottom substrate in a respective one of the vias.

16. The semiconductor package of claim 13 wherein:
each of the vias is sized and configured to accommodate the advancement of the solder balls on the top substrate therein to a depth wherein the top substrate contacts the package body.

17. The semiconductor package of claim 13 wherein each of the vias has a generally frusto-conical configuration.

18. A semiconductor package comprising:
a substrate including a plurality of contacts, at least some of the contacts having solder balls which are each of a first maximum diameter disposed thereon; and
at least one electronic component attached to the bottom substrate and electrically connected to at least one of the contacts thereof;
a package body at least partially encapsulating the bottom substrate and the electronic component, the package body including a plurality of vias disposed therein and extending to respective ones of the solder balls of the bottom substrate; and
a semiconductor package including a plurality of contacts, at least some of which each have a solder ball of second maximum diameter substantially equal to the first maximum diameter disposed thereon, the solder balls of the semiconductor package being mechanically and electrically connected to respective ones of the solder balls of the bottom substrate, with the vias being sized and configured to accommodate the advancement of the solder balls on the semiconductor package therein to a depth wherein the semiconductor package is disposed in extremely close proximity to the package body.

19. The semiconductor package of claim 18 wherein:
each of the vias is sized and configured to accommodate the advancement of the solder balls on the semiconductor package therein to a depth wherein the semiconductor package contacts the package body.

20. The semiconductor package of claim 18 wherein the electronic component comprises at least one semiconductor die which is electrically connected to at least some of the contacts of the bottom substrate by solder balls.

* * * * *